United States Patent
Sattler et al.

(10) Patent No.: US 10,545,034 B2
(45) Date of Patent: Jan. 28, 2020

(54) RECOGNITION OF PROXIMITY AND COLLISION

(71) Applicants: Stefan Sattler, Forchheim (DE); Stefan Schuster, Ebermannstadt (DE); Philipp Surm, Pinzberg (DE)

(72) Inventors: Stefan Sattler, Forchheim (DE); Stefan Schuster, Ebermannstadt (DE); Philipp Surm, Pinzberg (DE)

(73) Assignee: SIEMENS HEALTHCARE GMBH, Erlangen (DE)

( * ) Notice: Subject to any disclaimer, the term of this patent is extended or adjusted under 35 U.S.C. 154(b) by 24 days.

(21) Appl. No.: 15/390,267

(22) Filed: Dec. 23, 2016

(65) Prior Publication Data
US 2017/0184421 A1 Jun. 29, 2017

(30) Foreign Application Priority Data

Dec. 23, 2015 (DE) .................. 10 2015 226 622

(51) Int. Cl.
*G01D 5/241* (2006.01)
*G01D 18/00* (2006.01)
(Continued)

(52) U.S. Cl.
CPC .............. *G01D 5/241* (2013.01); *G01D 18/00* (2013.01); *H03K 17/955* (2013.01);
(Continued)

(58) Field of Classification Search
CPC ...... G01D 5/241; G01D 18/00; H03K 17/975; H03K 17/955; H03K 2217/96078; H03K 2017/9604; H03K 2017/9602
See application file for complete search history.

(56) References Cited

U.S. PATENT DOCUMENTS

| 4,766,368 A | 8/1988 | Cox |
| 8,269,176 B2 | 9/2012 | Ambrosio |

(Continued)

FOREIGN PATENT DOCUMENTS

| CN | 101010038 A | 8/2007 |
| CN | 103034378 A | 4/2013 |

(Continued)

OTHER PUBLICATIONS

German Office Action for related German Application No. 10 2015 226 622.2 dated Feb. 14, 2017, with English Translation.

(Continued)

*Primary Examiner* — Akm Zakaria
(74) *Attorney, Agent, or Firm* — Lempia Summerfield Katz LLC

(57) ABSTRACT

Systems and methods are provided for detecting proximity to and collisions with medical devices. A capacitive sensor element includes a compressible insulator layer that has a first conductor track arrangement on a first surface and a second conductor track arrangement on a second surface. The second surface lies opposite the first surface. The sensor apparatus further includes an evaluation device for repeated acquisition of a capacitance value of the sensor element. The evaluation device is configured to output a proximity signal when the respective capacitance value reaches or exceeds a predetermined first threshold value, and is configured to output a collision signal when the respective capacitance value reaches or exceeds a predetermined second threshold value. The second predetermined threshold value is higher than the first predetermined threshold value.

15 Claims, 6 Drawing Sheets

(51) Int. Cl.
*H03K 17/955* (2006.01)
*H03K 17/975* (2006.01)
*H03K 17/96* (2006.01)

(52) U.S. Cl.
CPC ... *H03K 17/975* (2013.01); *H03K 2017/9602* (2013.01); *H03K 2017/9604* (2013.01); *H03K 2217/96078* (2013.01)

(56) References Cited

U.S. PATENT DOCUMENTS

| | | | |
|---|---|---|---|
| 8,269,178 B2 | 9/2012 | Blom et al. | |
| 2006/0243462 A1 | 11/2006 | Schilling | |
| 2007/0242805 A1 | 10/2007 | Somers | |
| 2008/0018608 A1* | 1/2008 | Serban | G06F 3/0416 |
| | | | 345/173 |
| 2008/0018611 A1 | 1/2008 | Serban et al. | |
| 2012/0038583 A1 | 2/2012 | Westhues | |
| 2012/0262298 A1* | 10/2012 | Bohm | G01N 27/3274 |
| | | | 340/604 |
| 2013/0076375 A1* | 3/2013 | Hanumanthaiah | H03K 17/962 |
| | | | 324/661 |
| 2015/0117615 A1 | 4/2015 | Dirauf et al. | |
| 2016/0033342 A1* | 2/2016 | Lyon | G01L 1/142 |
| | | | 73/862.626 |
| 2017/0054427 A1* | 2/2017 | Baney | H03H 7/40 |
| 2017/0184421 A1 | 6/2017 | Sattler | |

FOREIGN PATENT DOCUMENTS

| | | |
|---|---|---|
| CN | 103221911 A | 7/2013 |
| CN | 206727981 U | 12/2017 |
| DE | 4132117 C1 | 4/1993 |
| DE | 102012012664 A1 | 12/2013 |
| DE | 102013222115 A1 | 5/2015 |

OTHER PUBLICATIONS

Chinese Office Action for Chinese Application No. 201611204596.2 dated Nov. 4, 2019, with English translation.

* cited by examiner

RECOGNITION OF PROXIMITY AND COLLISION

CROSS-REFERENCE TO RELATED APPLICATIONS

This application claims the benefit of DE 10 2015 226 622.2, filed on Dec. 23, 2015, which is hereby incorporated by reference in its entirety.

TECHNICAL FIELD

Embodiments relate to a sensor apparatus for recognizing a proximity to a medical device and to a corresponding method for recognizing a proximity to a medical device.

BACKGROUND

Medical imaging systems nowadays are becoming ever more flexible and capable of adaptation to the respective tasks. This also includes the mechanical moving of the devices with or around the patient in order to obtain better positions for imaging or for obtaining series of images, for example. Such moving or movement is at least partly controlled by the system itself and partly by the operating personnel. Movements are thus made to specific coordinates (automatic mode) or the C-arm is repositioned, for example, by joystick deflections (manual mode). In these movements, however, there is a risk of there being an obstacle or even a patient in the path of the movement. There is thus the acute danger of bruising and other injuries.

For such collision problems there are already approach protection mechanisms provided by pressure sensor systems. However, triggering of any sensor system indicates that a collision with the obstacle has already happened. In order to prevent this, different proximity systems such as ultrasound sensors, infrared sensors or capacitive measurement systems are used. A disadvantage here however is that these systems may only detect an approach, but not a collision in the required safety class (comparable to SIL2 or to the first-error security additionally demanded in medical technology, according to which any error must immediately be recognized and reported). Another disadvantage is that liquids on the surface of the device, from an operating theater, for example, adversely effect capacitive sensors lying under the casing and make an exact proximity measurement impossible, since the dielectricity constant of the medium (e.g., of the measurement range) is so high that an intrusion of a part of the body into the measurement range will no longer be perceived at all.

Dedicated systems have thus previously been used for the proximity sensor systems and separate systems for the collision recognition. With collision recognition, an emergency stop is triggered that brings the system to a halt immediately and remains active until the cause of the triggering has been rectified and the system no longer recognizes a collision. With the proximity sensor systems, for example, an emergency stop may likewise be triggered as from a specific threshold value in the evaluation. However, provided that a distance value to an object is identified, just the speed of approach may be reduced (e.g., linearly or exponentially). The advantage of proximity sensor systems is that any possible halt of the system may already be initiated shortly before the real collision.

The advantage of collision recognition is that the evaluation may be done via a mechanical signal that may not be influenced by wetting by liquids or the like, that enables this collision recognition to also be configured for safety. For example, with a supervision measure a signal abort occurs when the sensor is touched and activated by the object. With a non-contact sensor this function supervision may not be carried out until the last relevant point.

SUMMARY AND DESCRIPTION

Embodiments provide a safe interaction with medical devices, especially medical imaging systems.

Embodiments are provided including a sensor apparatus for recognizing a proximity to a medical device. The sensor apparatus includes a capacitive sensor element with a compressible insulator layer, having a first conductor track arrangement on a first surface and a second conductor track arrangement on a second surface lying opposite the first surface. Each of the conductor track arrangements includes one or more gaps between conductor track sections in each case. The sensor apparatus further includes an evaluation device for repeated acquisition of a capacitance value of the sensor element. The evaluation device is configured to output a proximity signal when the respective capacitance value reaches or exceeds a predetermined first threshold value, and to output a collision signal when the respective capacitance value reaches or exceeds a predetermined second threshold value that is higher than the first threshold value.

The sensor apparatus is configured to detect both a proximity of an object to the sensor apparatus and also a collision of an object with the sensor apparatus. The sensor apparatus is equipped with a specific capacitive sensor element that contains a compressible insulator layer made of a plastic or a foam for example. The insulator layer may be configured as a disk or plate shape and includes a conductor track arrangement on both opposite sides in each case. The conductor track arrangements each include a number of conductor track sections and between them one or more gaps. Such a conductor track arrangement may, for example, be a perforated circuit board or an arrangement of parallel conductor track strips. The conductor track arrangements are flexible, so that the insulator layer may be pushed in, and a stray field from the respective conductor track arrangement may emerge in the direction of the side facing away from the insulator layer in order to guarantee an increased sensibility in relation to proximity of an object to the sensor apparatus. The evaluation device acquires, e.g. continually, a capacitance between the two conductor track arrangements and compares the acquired values with two different threshold values. On reaching or exceeding a first (low) threshold value a proximity signal is created, that is intended to signal that a proximity is critical. Such a threshold value is to be set in accordance with the respective requirements. If the acquired capacitance value reaches or exceeds a second (higher) threshold value, then a collision is assumed, and a collision signal is created. The second threshold value may also be predetermined in accordance with requirements.

The first conductor track arrangement may include a number of first conductor tracks and the second conductor track arrangement a number of second conductor tracks. All first conductor tracks are arranged in at least one direction in parallel to a main extension plane of the insulator layer offset in relation to all second conductor tracks. The conductor tracks of the second conductor track arrangement are not located on the lower side of the insulator layer directly below the conductor tracks of the first conductor track arrangement on the upper side of the insulator layer. Through the offset of the conductor track arrangements more stray field is created.

In an embodiment, all first and second conductor tracks below one another in a main action area of the sensor element may be parallel at least in sections. The totality of conductor tracks (apart from connecting sections) may run in parallel on the upper side and lower side of the insulator layer. Such a parallel arrangement may be provided, for example, by using copper conducting tracks. A parallel course is to be understood as not only straight tracks, but for example, also serpentine conductor tracks that run next to one another without intersecting. Serpentine conductor tracks possibly have the advantage that the tracks are flexible in a number of directions. In the widest sense concentric tracks are also considered as parallel.

In an embodiment, vertical projections of the first conductor tracks on the main extension plane of the insulator layer on one side and vertical projections of the second conductor tracks on the main extension plane on the other side touch if need be, but do not overlap. The conductor tracks of one conductor track arrangement include in pairs in each case spaced apart by at least the width of one conductor track of the other conductor track arrangement. Such a geometry enables good results to be achieved in respect of proximity recognition and collision recognition.

The evaluation device may feature a thermistor for a temperature compensation of the proximity signal or collision signal. Such a temperature compensation may be necessary if an especially high reliability of the sensor apparatus is to be achieved under different environmental conditions.

A deformable protective layer may be arranged on one of the conductor tracks. The conductor track arrangement will thus be specifically protected by the protective layer on the side facing away from the insulator layer. The protection allows the robustness of the sensor apparatus in relation to mechanical, physical and chemical influences to be greatly improved.

In an embodiment, the evaluation device of the sensor apparatus may be provided so that the evaluation device recognizes a sudden change in the acquired capacitance values over time and creates an error signal relating thereto. Such sudden changes are produced for example in the event of a short circuit or a break in a wire. As a result not only proximity and collision processes are recognized by the sensor apparatus, but there may also be self-supervision in respect of any damage to the sensor apparatus.

The self-supervision may be further improved by the evaluation device also being configured to measure an electrical resistance of the first and/or second conductor track arrangement. The configuration enables a wire break to be better recognized with suitable circuitry. In addition, under some circumstances ageing processes may also be recognized.

In an embodiment, a medical device, having a casing and/or a carrier element may be provided with a sensor apparatus, as described above, that is fastened to the casing and/or the carrier element. The carrier element may, for example, include a metallic support structure or a metallic chassis, with which any stray fields are screened out. If the sensor apparatus is arranged immediately under the casing then the casing acts as a corresponding protective layer.

In an embodiment, a method is provided for recognition of proximity to a medical device. The method includes repeated acquisition of a capacitance value of a capacitive sensor element with a compressible insulator layer, having a first conductor track arrangement on a first surface and a second conductor track arrangement on a second surface lying opposite the first surface. Each of the conductor track arrangements includes one or more gaps between conductor track sections. The method further includes creation of a proximity signal when the respective capacitance value reaches or exceeds a predetermined first threshold value, and of a collision signal when the respective capacitance value reaches or exceeds a predetermined second threshold value that is higher than the first threshold value.

The scope of the present invention is defined solely by the appended claims and is not affected to any degree by the statements within this summary. The present embodiments may obviate one or more of the drawbacks or limitations in the related art.

DETAILED DESCRIPTION

Individual features may be realized not just in the combinations described, but also in isolation or in other technically sensible combinations.

To avoid dangerous situations or even collisions with a medical device (e.g., a C-arm x-ray device), the medical device may be equipped with a sensor apparatus. The medical device may include multiple sensor apparatuses.

Figure 1:
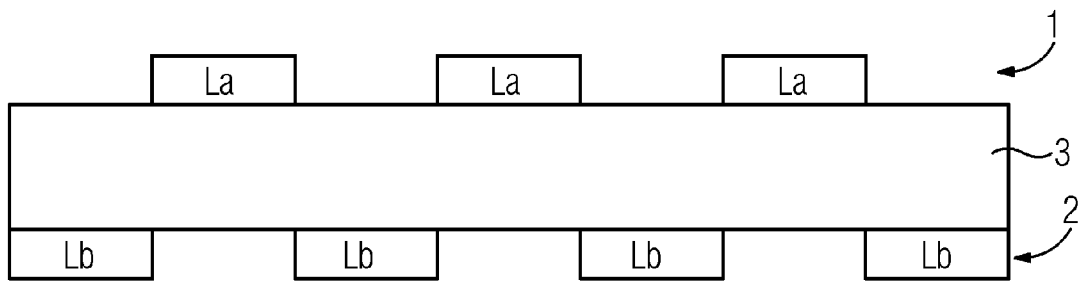
FIG. 1 depicts a basic diagram of a capacitive sensor element according to an embodiment.

According to an embodiment, a capacitive sensor element 15 of the sensor apparatus is depicted in cross-section in FIG. 1. The capacitive sensor element 15 includes a plate capacitor. A flexible or compressible layer 3 is located as dielectric material between two conductor track arrangements 1 and 2. This insulator layer 3 may, for example, involve plastic, foam or similar material. In a collision, the conductor track arrangements 1 and 2 may be pushed towards one another, so that the resulting capacitance of the capacitive sensor element changes.

The first conductor track arrangement 1 has a plurality of conductor sections or conductors La. The second conductor track arrangement 2, in a similar manner, has a plurality of conductor sections or individual conductors Lb. The conductors La and Lb may be provided, as in the example of FIG. 1, as conductor tracks or conductor strips, respectively, that run in straight lines and in parallel. In such cases the conductors La not only run in parallel among themselves, but also in parallel relative to the conductors Lb. However, the conductors La and Lb do not have to run in a straight line over the entire length. Instead the conductors may also contain kinks or curves. The conductors may, for example, run in a zigzag or a serpentine shape, without touching or intersecting with the respective neighboring conductor in doing so. It is also not necessary for all conductors to run in parallel to one another. Instead, one conductor track arrangement 1 or 2 may also be provided, for example, as an electrically conductive perforated board.

The spacing between neighboring conductors La of the first conductor track arrangement 1 is configured so that the spacing corresponds to the width of a conductor Lb of the second conductor track arrangement 2 and where necessary also to the width of a conductor La of the first conductor track arrangement 1. The widths of the individual conductors may also be configured to be larger or smaller, provided gaps remain between the individual conductors.

Figure 2:
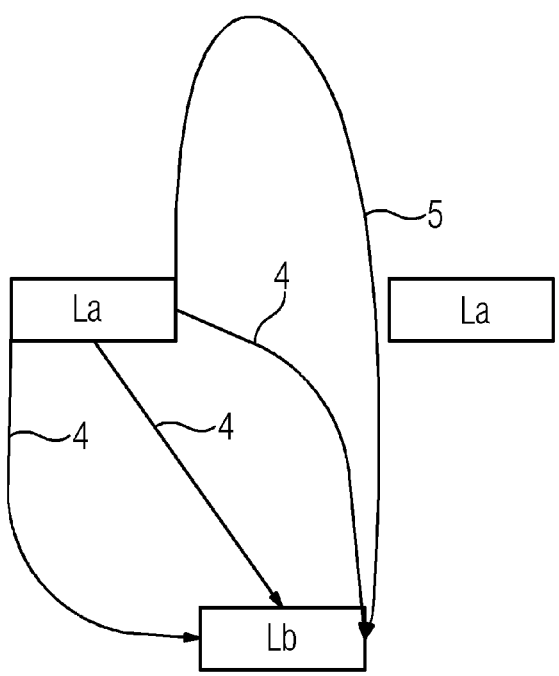
FIG. 2 depicts a field diagram of a section of the sensor element from FIG. 1 according to an embodiment.

FIG. 2 depicts a field distribution of an electrical field between two of the conductors La of the first conductor track arrangement 1 on the one side and a conductor Lb of the second conductor track arrangement 2. First field lines 4 largely run through the insulator layer 3 not shown in FIG. 2 (e.g., from the conductor La to the conductor Lb). The field lines 4 will only be influenced by a collision, providing that an object strikes the capacitive sensor element directly or indirectly and the insulator layer 3 will be compressed, for example.

In addition, the electrical field also has field lines 5, of which a significant portion run outside the capacitive sensor element. The field lines 5 contribute to a measurement field with which a proximity of an object to the sensor apparatus may be detected. For an event, a prerequisite for the detection is that the object influences the measurement field or the field lines 5, respectively. This is the case with human tissue, for example, but is not the case with many plastics.

Thus, a sensor construction that makes it possible, with a single sensor, to create the conditions for avoiding collisions with capacitively detectable objects and for securely recognizing collisions with capacitively non-detectable objects on contact is provided.

Figure 3:
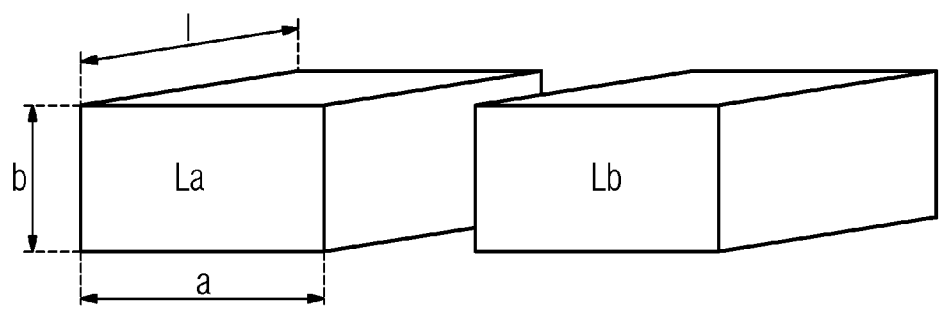
FIG. 3 depicts a basic diagram for calculating a capacitance according to an embodiment.

The capacitance of such a sensor element is able to be approximated via the following equation of the capacitance of two conductor tracks lying next to one another in accordance with FIG. 3:

$$C_s = \varepsilon_0 * \varepsilon_r * \frac{(a+b)*l}{d}$$

In this equation, the distance d only plays the role of a fixed factor, but not of an influencing variable for the proximity measurement. In the event of a collision, the distance d between the conductor tracks will naturally change, since the insulator layer 3 is able to be compressed.

In the remaining dimensions, a corresponds to the thickness of the conductor track, b corresponds to the width of the conductor track, and l corresponds to the length of the two conductor tracks, provided the tracks run in parallel. The model thus applies to rectangular-shaped longitudinal conductors that run in parallel to one another. The model may, however, also be employed as an approximation for other conductor shapes.

The flexible or compressible insulator layer 3 between the two conductor track arrangements 1 and 2 is an electrically-insulating layer having a high compressibility, such as, for example, silicons, foams, gases etc. When selecting the material, the reproducible decompression (e.g., reset capability) back to the original state is a factor, as is the force that is to be exerted on the material in order to compress the material significantly. Corresponding to the compression, the value Cm is decisive for the choice of material (e.g., the larger Cm is, the larger is the differentiation during compression).

Figure 4:
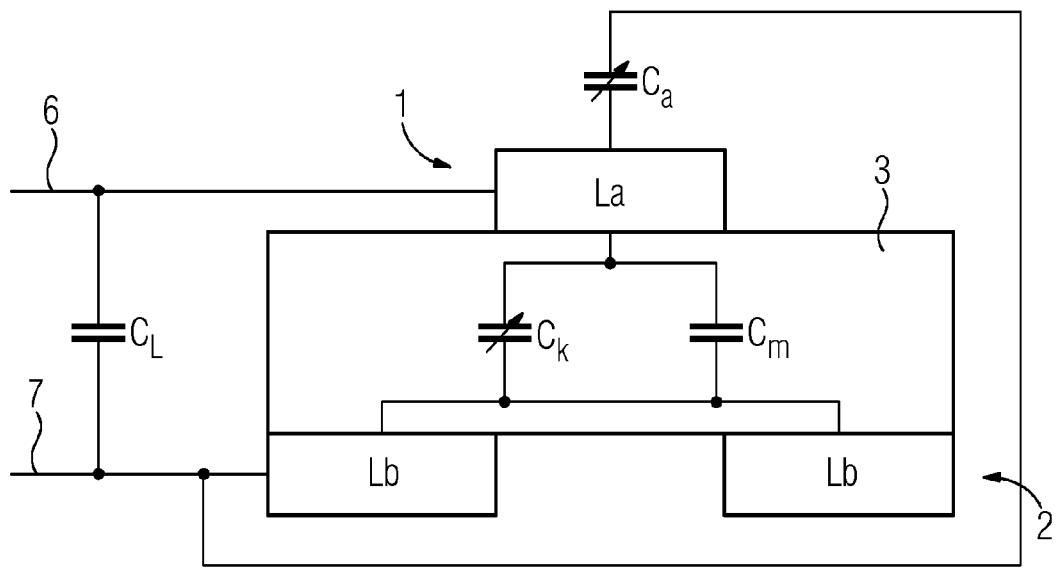
FIG. 4 depicts an equivalent circuit diagram for determining a capacitance of a conductor arrangement in accordance with the sensor element of FIG. 1 according to an embodiment.

The sensor element with possible supply lines is depicted by the circuit of FIG. 4. Accordingly, a conductor La is connected to a first line 6, and a conductor Lb is connected to a second line 7 of a measurement circuit or evaluation circuit, for example. The line capacitance Cl is produced between the two lines 6 and 7. A proximity capacitance Ca is produced from the first conductor track arrangement 1 to the second conductor track arrangement 2 or from conductor La to conductor Lb, which represents the measurement field outside the sensor element. Within the insulator layer 3, a parallel circuit of a collision capacitance Ck and a material capacitance Cm, which is connected between the conductors La and Lb, is produced. For the sake of an improved overview, the conductors Lb outside the insulator layer 3 are not connected to one another in FIG. 4.

The line capacitance Cl and the material capacitance Cm may be fixed capacitances, of which the temperature dependency (e.g., Ohmic portion) may be compensated for by a thermistor. The proximity capacitance Ca changes when an object that may be detected capacitively approaches the sensor element. The collision capacitance Ck is the capacitance of which a change in value will be triggered by a collision.

Figure 8:
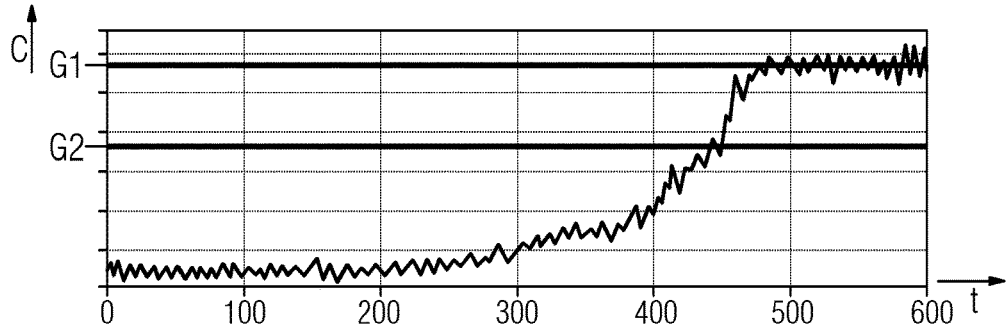
FIG. 8 depicts a capacitive waveform of a sensor element over time during deformation according to an embodiment.

In order to recognize a difference between proximity and collision, calibrations may be undertaken and threshold values defined (cf. also FIG. 8 and associated text). Since the capacitance for bumping into (e.g., collision with contact) an obstacle according to the formula described above doubles for a reduction of the distance by a half, setting of a threshold value in relation to a relatively small proximity capacitance may be provided.

Figure 5:
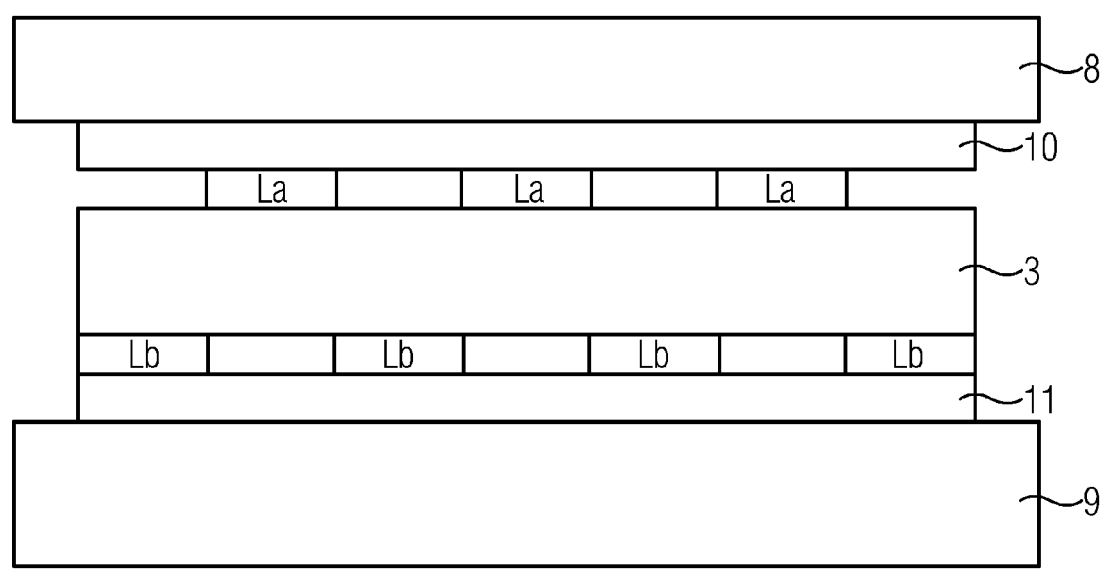
FIG. 5 depicts a form of the structure of a capacitive sensor element from FIG. 1 according to an embodiment.
Figure 6:
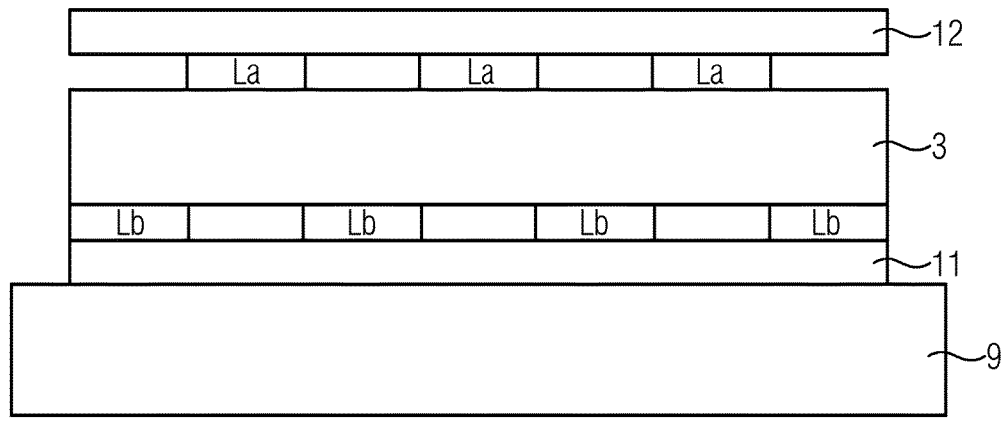
FIG. 6 depicts a further form of the structure of a capacitive sensor element in accordance with FIG. 1 according to an embodiment.

Two further embodiments are depicted in FIGS. 5 and 6, into which a sensor element of a sensor apparatus may be built in each case. In accordance with the example of FIG. 1, the medical device includes a solid casing 8. In addition, the medical device includes a suspension mount or a carrier 9 as the carrier component. The sensor element, as shown in FIG. 1, is glued in the present example with the aid of an adhesive film 10 to the casing 8 and with a second adhesive film 11 to the carrier 9. Instead of the adhesive films 10 and 11, other adhesive media may also be used in order to provide a safe reformation of the compressible insulator layer (e.g., plastic or foam). Gluing on one side may also be provided.

The carrier 9 may, for example, include a metallic chassis that, by the stability of the chassis, provides that only the flexible or contractible insulator layer 3 will be pushed in during a collision. In this case, the metal has the advantage that an electromagnetic screening of the sensor in the direction of further device components may also be realized.

In the example of FIG. 6, the sensor element from FIG. 1, as in the previous example, is fastened by an adhesive film 11 to a carrier 9. In FIG. 6, however, the sensor apparatus includes a yielding surface. A deformable cover layer 12 is provided on the upper side of the sensor element (e.g., on the first conductor track arrangement 1). The deformability of the sensor surface provides that the sensor may also be used directly on the surface of a medical device. The cover layer may be covered with a suitable protective paint for the respective purpose. The protective paint produces a smaller basic capacitance and a higher sensibility, but also a reduced detection surface. The cover layer 12 reduces the field change that is achieved by an approaching object. Specifically, because of the cover layer, the object may no longer get as close to the sensor element 1, 2, 3. The cover layer 12 may be configured as thin as possible, or where necessary, a coat of lacquer may be used as the cover layer 12.

In an embodiment, the entire sensor element is flexible (e.g., in a number of spatial directions). The flexibility provides for attaching the sensor element to curved surfaces, such as may be found on medical devices. In this way, an even larger field of use for the sensor apparatus and a greater adaptation to the requirements are provided.

Figure 7:
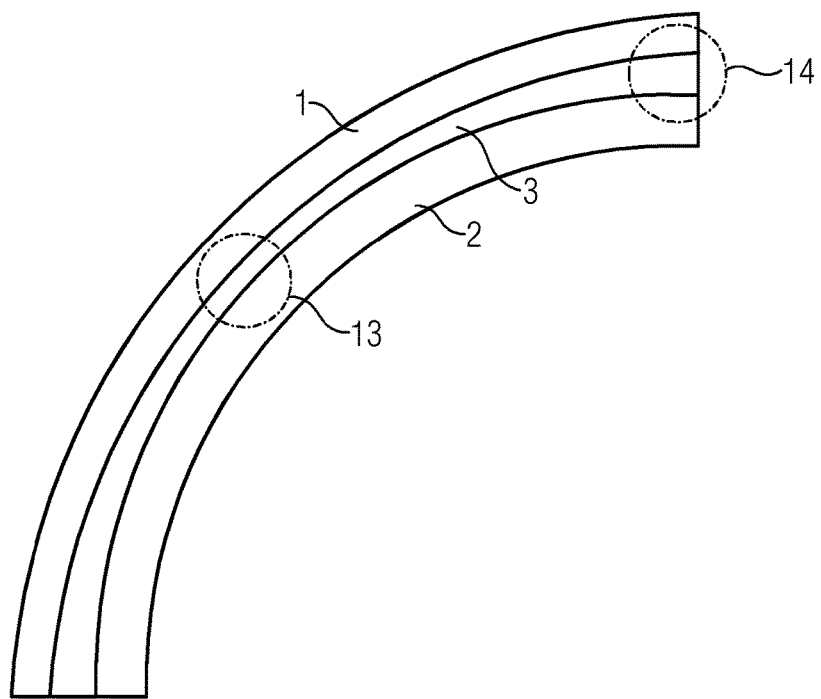
FIG. 7 depicts a diagram of a sharply curved capacitive sensor element according to an embodiment.

FIG. 7 depicts an example in which, for example, the sensor element is attached to a curved casing (not shown). Flexible conductor track films may be used for this type of flexible sensor element, for example, so that a correspondingly yielding surface is produced. The flexible conductor tracks, for example, depending on the production process, allow a very fine bending radius to be realized.

In the schematic diagram of FIG. 7, the two conductor track arrangements 1 and 2 are depicted as continuous. However, the diagram may also include a cross-section at right angles to one of the cross-sections of FIG. 1, 5 or 6, so that on the outside of the sensor element, only one conductor La and on the inside a conductor Lb is to be seen. Due to the curvature of the sensor element, the thickness of the compressible insulator layer at point 13 (e.g., approximately in the middle of the sensor element) is smaller than at a point 14 on the edge of the sensor element. The thickness results in a reduction in the distance between the two conductors La and Lb. Such a reduction in the distance may, for example, be compensated for by a software-based recalibration, where the reduction arises as a result of the curvature of the sensor element.

The sensor data is evaluated electronically. From a specific first threshold value G1, a proximity is detected, and as from a higher second threshold value G2 (cf. FIG. 8), a collision is detected. The capacitance C is, for example, continuously acquired or observed over the time t. In an example, an object is approaching the sensor element or the sensor apparatus and collides with the sensor element. Since the capacitance of the sensor element through a mere approach of the object may not exceed a specific maximum (e.g., approximately of the first threshold value G1), a detection of an increase of the measured value beyond the maximum indicates that there has been a collision. An evaluation device may automatically carry out an evaluation of the measured value relating to the capacitance of the sensor element. The evaluation device may output a corresponding proximity signal that continuously depends, for example, on the distance of the object from the sensor apparatus. The proximity signal may also be purely binary. In an example, the first threshold value G1 is 0, and any proximity of an object is indicated from the start.

The evaluation device outputs a collision signal if the measured value exceeds the second threshold value G2. This collision signal typically involves a binary signal.

In an embodiment, a first error recognition by the evaluation electronics that covers the entire capacitance range of the sensor may be provided. For example, a simpler and safer sensor apparatus for proximities and collisions may be provided.

In an example, an "emergency-off" may be provided for fast-moving systems. An evaluation by the circuit may be provided with, for example, 1,000 samples per second. A 1 ms trigger may be implemented, and fast-moving systems will be detected early to be able to brake before a collision.

Figure 9:
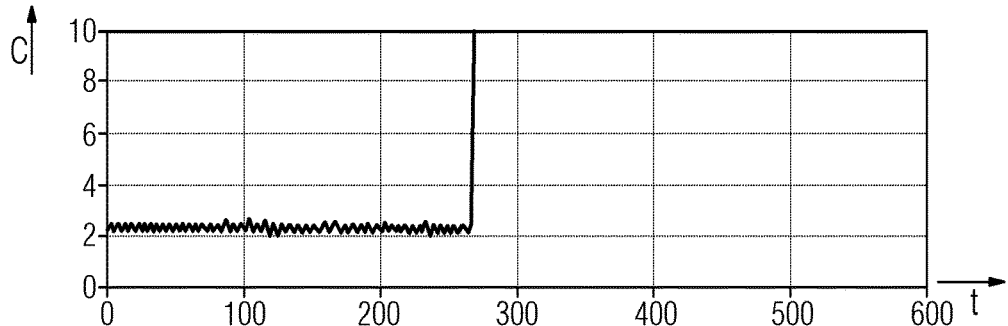
FIG. 9 depicts a capacitive waveform of the sensor element on breakage of a screening conductor wire according to an embodiment.
Figure 10:
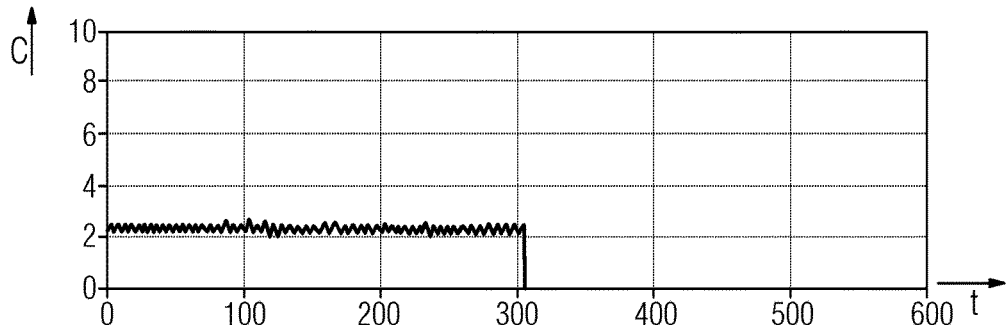
FIG. 10 depicts a capacitive waveform of a sensor element on breakage of the sensor line according to an embodiment.
Figure 11:
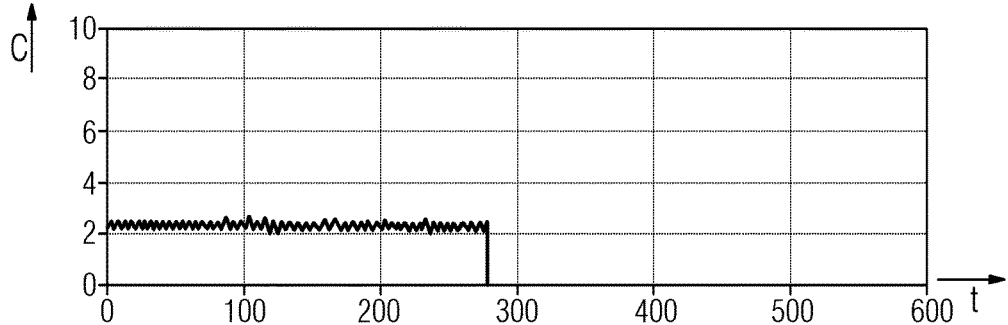
FIG. 11 depicts a capacitive waveform of a sensor element for a short circuit at the evaluation electronics according to an embodiment.

The sensor apparatus described above combines in a single sensor a collision avoidance technology (e.g., capacitive predictive) and a first error-safe collision recognition. The sensor apparatus may further provide a reduction in failures. For example, short circuits and wire breaks may be recognized by sudden changes of the measured values, as FIGS. 9 to 11 depict. If there is a break in a wire of a screening line, the measured value immediately jumps upwards, as FIG. 9 depicts. If there is a wire break in a signal line, the measured value jumps downwards, as is shown in FIG. 10. With a short circuit, the measured value in accordance with FIG. 11 likewise jumps downwards.

Figure 12:
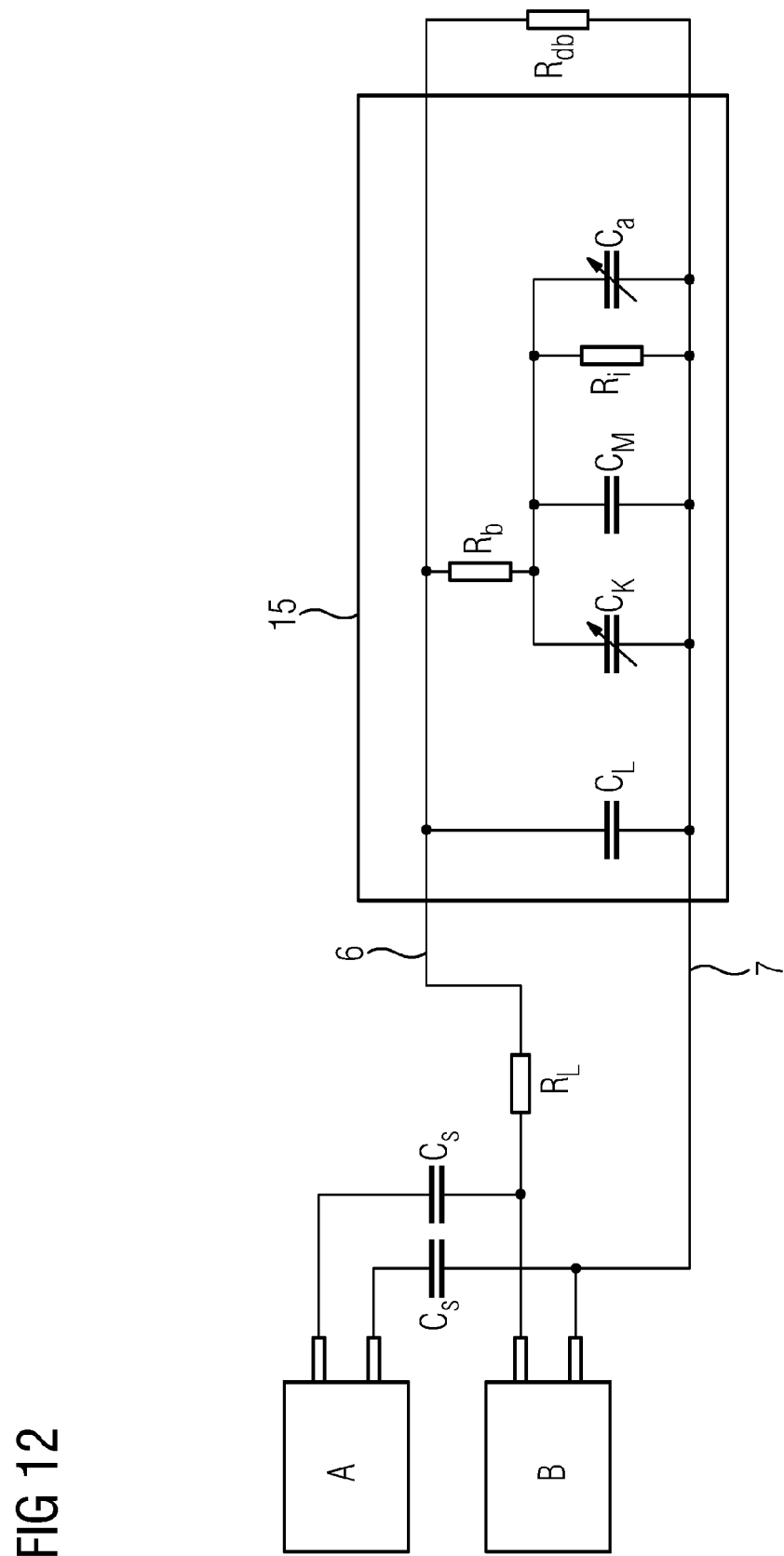
FIG. 12 depicts a circuit diagram of a sensor apparatus with improved function testing according to an embodiment.

These examples produce a greater guarantee of safety through the collision recognition in the measurement system of the proximity sensor system and provide the option of safely recognizing a failure. Further, the system may be configured to be more fault-tolerant or if the calibration of the sensor system does not allow these types of error recognition, then a further measurement system may also be used, as depicted in FIG. 12. In the system of FIG. 12, the evaluation device includes two measuring units A and B. Via the measuring unit A, as described above, the capacitance is measured, while the second measuring unit B checks a resistance Rdb. This unit is connected via the sensor element 15 using a two-wire line, of which the line resistance amounts to R1, in parallel to the measuring unit A and the measuring unit B. The measuring unit A is connected via two capacitors Cs only for alternating current to the sensor element. The sensor element 15 is depicted by the circuit diagram of FIG. 4. In this case, the parallel switching of the capacitances Ck, Cm, and Ca is supplemented by a parallel Ohmic resistor Ri of the insulator layer 3. The parallel circuit is connected in series via an Ohmic conductor track resistor Rb to the one line 6, which leads, along with the other line 7, to both measuring units A and B. The resistor Rdb is located between the two lines 6 and 7.

With a wire break of the sensor element, the measured resistance would become infinitely large. With a short circuit, practically no resistance would be able to be measured any longer.

In cases in which the predictive, capacitive measurement is adversely affected (e.g., by contamination or by materials such as plastic that may not be detected), secure collision recognition will continue to function correctly, since it is independent of external influences.

Figure 13:
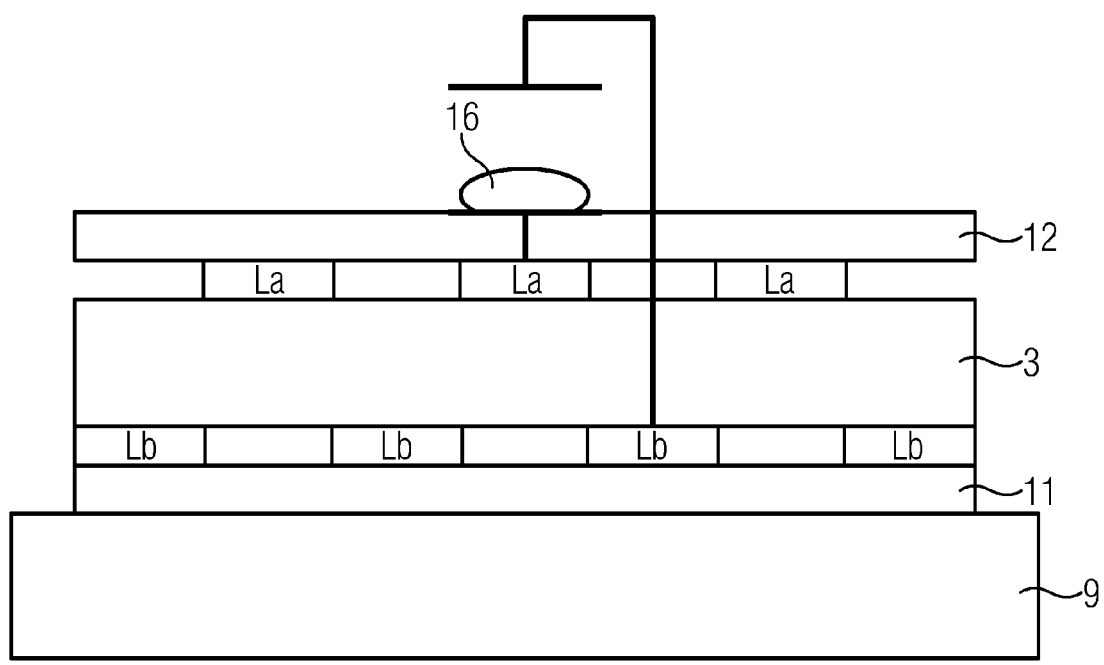
FIG. 13 depicts a circuit diagram that takes account of contamination of the capacitive sensor element according to an embodiment.

In addition, as explained in conjunction with FIG. 13, a contamination 16 of the detection space may be identified via an evaluation of the capacitances (e.g., constantly increased proximity capacitance without increase of the collision capacitance). In the example of FIG. 13, the layout of FIG. 6 is selected. Through the contamination 16, the relative dielectricity constant εr increases, which leads to a correspondingly constant change in the measured capacitance. The contamination produces a variation in the capacitance within the proximity sensor. Through a corresponding evaluation, a malfunction of the sensors through contamination may thus be excluded.

It is to be understood that the elements and features recited in the appended claims may be combined in different ways to produce new claims that likewise fall within the scope of the present invention. Thus, whereas the dependent claims appended below depend from only a single independent or dependent claim, it is to be understood that these dependent claims may, alternatively, be made to depend in the alternative from any preceding or following claim, whether independent or dependent, and that such new combinations are to be understood as forming a part of the present specification.

While the present invention has been described above by reference to various embodiments, it may be understood that many changes and modifications may be made to the described embodiments. It is therefore intended that the foregoing description be regarded as illustrative rather than limiting, and that it be understood that all equivalents and/or combinations of embodiments are intended to be included in this description.

The invention claimed is:

1. A sensor apparatus configured for recognizing a proximity and a collision of an object with the sensor apparatus, the sensor apparatus comprising:
a capacitive sensor element comprising compressible insulator layer configured with a first conductor track arrangement on a first surface of the capacitive sensor element and a second conductor track arrangement on a second surface of the capacitive sensor element, the second surface lying opposite the first surface, wherein each of the first conductor track arrangement and the second conductor track arrangement includes one or more gaps between conductor tracks, wherein the conductor tracks of the first conductor track arrangement are offset in relation to the conductor tracks of the second conductor track arrangement; and
an evaluation device configured to measure a capacitance value between the first conductor track and the second conductor track and to compare the capacitance value with a predetermined first threshold value and a predetermined second threshold value, the evaluation device further configured to output a proximity signal when the capacitance value reaches or exceeds a predetermined first threshold value, and to output a collision signal when the capacitance value reaches or exceeds a predetermined second threshold value that is higher than the first threshold value.

2. The sensor apparatus of claim 1, wherein the first and second conductor tracks are parallel at least in sections in a main action area of the sensor element.

3. The sensor apparatus of claim 1, wherein vertical projections of the first conductor tracks on a main extension plane of the compressible insulator layer on the one side and vertical projections of the second conductor tracks on the main extension plane on the other side touch, but do not overlap.

4. The sensor apparatus of claim 1, wherein the evaluation device further comprises a thermistor for a temperature compensation of the proximity signal or collision signal.

5. The sensor apparatus of claim 1, further comprising a deformable protective layer arranged on the first conductor track arrangement.

6. The sensor apparatus of claim 1, wherein the evaluation device is further configured to recognize a sudden change in the acquired capacitance values over time and to create an error signal relating to the sudden change.

7. The sensor apparatus of claim 1, wherein the evaluation device is further configured to measure an electrical resistance of the first conductor track arrangement, second conductor track arrangement, or first and second conductor track arrangement.

8. A medical device comprising:
a casing; and
a sensor apparatus fastened to the casing, the sensor apparatus comprising:
a capacitive sensor element comprising a compressible insulator layer configured with a first conductor track arrangement on a first surface of the capacitive sensor element and a second conductor track arrangement on a second surface of the capacitive sensor element, the second surface lying opposite the first surface, wherein each of the conductor track arrangements includes one or more gaps between conductor tracks and the conductor tracks of the first conductor track arrangement and the second conductor track arrangement are offset to one another;
a deformable protective layer arranged on the first conductor track arrangement; and
a measurement circuit configured for repeated measurement of a capacitance value between the first conductor track arrangement and the second conductor track arrangement, the measurement circuit further configured to output a proximity signal when the capacitance value reaches or exceeds a predetermined first threshold value, and to output a collision signal when the capacitance value reaches or exceeds a predetermined second threshold value that is higher than the first threshold value.

9. A method for recognizing proximity to a medical device, the method comprising:
measuring, by an evaluation circuit, a capacitance value of a capacitive sensor element with a compressible insulator layer, the capacitive sensor element comprising a first conductor track arrangement on a first surface and a second conductor track arrangement on a second surface lying opposite the first surface, wherein each of the conductor track arrangements includes one or more gaps between conductor track sections, wherein the conductor tracks of the first conductor track arrangement and the second conductor track arrangement are offset to one another;
generating, by the evaluation circuit, a proximity signal when the capacitance value reaches or exceeds a predetermined first threshold value; and
generating, by the evaluation circuit, a collision signal when the respective capacitance value reaches or exceeds a predetermined second threshold value that is higher than the first threshold value.

10. The method of claim 9, wherein the first and second conductor tracks are parallel at least in sections in a main action area of a sensor element.

11. The method of claim 9, wherein vertical projections of the first conductor tracks on the main extension plane of the compressible insulator layer on the one side and vertical projections of the second conductor tracks on the main extension plane on the other side touch, but do not overlap.

12. The method of claim 9, further comprising:
detecting a temperature value, wherein the proximity signal or collusion signal are generated further based on the temperature value.

13. The method of claim 9, wherein a deformable protective layer is arranged on the first conductor track arrangement.

14. The method of claim 9, further comprising:
    detecting a sudden change in the acquired capacitance values over time; and
    generating an error signal relating to the sudden change.

15. The method of claim 9, wherein measuring comprises:
    measuring an electrical resistance of the first conductor track arrangement and second conductor track arrangement.

* * * * *